United States Patent
Goat et al.

(10) Patent No.: US 7,750,538 B2
(45) Date of Patent: Jul. 6, 2010

(54) FERROELECTRIC DURABILITY

(75) Inventors: Christopher Andrew Goat, Offham (GB); Martin Paul Hardy, Gillingham (GB)

(73) Assignee: Delphi Technologies Holding S.arl, Troy, MI (US)

( * ) Notice: Subject to any disclaimer, the term of this patent is extended or adjusted under 35 U.S.C. 154(b) by 0 days.

(21) Appl. No.: 12/085,243

(22) PCT Filed: Nov. 24, 2006

(86) PCT No.: PCT/GB2006/004396

§ 371 (c)(1),
(2), (4) Date: Feb. 13, 2009

(87) PCT Pub. No.: WO2007/063284

PCT Pub. Date: Jun. 7, 2007

(65) Prior Publication Data

US 2009/0152991 A1 Jun. 18, 2009

(30) Foreign Application Priority Data

Nov. 30, 2005 (EP) .................................. 05257355

(51) Int. Cl.
*H01L 41/053* (2006.01)
(52) U.S. Cl. .................. 310/344; 310/364; 310/366
(58) Field of Classification Search ................ 310/344, 310/364, 366
See application file for complete search history.

(56) References Cited

U.S. PATENT DOCUMENTS

| 3,727,084 A | 4/1973 | Epstein |
| 5,422,022 A * | 6/1995 | Chamberlin, III ........... 508/390 |
| 6,573,639 B1 * | 6/2003 | Heinz et al. ................ 310/363 |
| 2003/0107301 A1 | 6/2003 | Asano et al. |
| 2003/0141786 A1 | 7/2003 | Saki |
| 2005/0052506 A1 * | 3/2005 | Yagi et al. ..................... 347/72 |

* cited by examiner

*Primary Examiner*—Walter Benson
*Assistant Examiner*—Bryan P Gordon
(74) *Attorney, Agent, or Firm*—Thomas N. Twomey

(57) ABSTRACT

A piezoelectric actuator for use in a fuel injection system of an internal combustion engine, the actuator comprising a stack of ferroelectric layers; an encapsulation for protecting the stack from the ingress of liquid; and oxygenation means for providing oxygen to the ferroelectric layers, the means positioned between the encapsulation and stack. The oxygenation means is preferably impregnated in a fabric which forms a layer between the encapsulation and the stack.

20 Claims, 3 Drawing Sheets

US 7,750,538 B2

FERROELECTRIC DURABILITY

TECHNICAL FIELD

The invention relates to an apparatus and method for improving ferroelectric durability. The apparatus and method relate to ferroelectric materials and their use in piezoelectric actuators in fuel injection systems and, in particular, to the reduction of fatigue in such piezoelectric actuators.

BACKGROUND OF THE INVENTION

The use of piezoelectric actuators in fuel injection systems is well documented. FIG. 1 is a sectional view of a known fuel injector 1 for an internal combustion engine. The injector 1 includes a piezoelectric actuator 2 having a piezoelectric stack 4 which is housed in a sheath or encapsulation 6, which is typically polymeric or metallic, to protect the actuator 2 from its environment. The encased actuator 2 is located within a fuel volume, referred to as the stack volume 8, which in use is filled with fuel at injection pressures. The actuator 2 is coupled to a valve needle 10 so as to control movement of the needle 10 towards and away from its seating 12$b$, thus controlling the supply of fuel through fuel channels 12$a$ in the nozzle 12 to a cylinder of a combustion engine (not shown).

The piezoelectric stack 4 comprises a multilayer structure 14, a section of which is shown in FIG. 2. The multilayer structure 14 includes a plurality of relatively thin ferroelectric ceramic layers 16 separated by a plurality of internal electrodes forming first and second electrode groups 18$a$, 18$b$. An example of a ferroelectric material used in piezoelectric actuators is lead zirconate titanate, commonly referred to as PZT (Pb(Zr$_x$Ti$_{1-x}$)O$_3$).

The electrodes of the first group 18$a$ are interdigitated with the electrodes of the second group 18$b$. The electrodes of the first group 18$a$ connect with a first external electrode 20$a$ and the electrodes of the second group 18$b$ connect with a second external electrode 20$b$. In use, the first and second external electrodes 20$a$, 20$b$ receive an applied voltage that produces an intermittent electric field between adjacent interdigitated electrodes 18$a$, 18$b$, which causes the stack 4 to extend and contract along the direction of the applied field. As a result, the valve needle 10 is operated so as to control injection into the associated engine cylinder.

SUMMARY OF THE INVENTION

In order to prevent surface shorting between exposed electrodes, the piezoelectric actuator may be passivated, for example, by means of the encapsulation or in addition thereto.

In use in a piezoelectric actuator, PZT will release oxygen into its surroundings which gives rise to oxygen vacancies in the ferroelectric material. An oxygen vacancy is a point defect in the ferroelectric material which carries an electric charge equal and opposite to two electrons. Approximately $5 \times 10^{-3}$ moles (1 ml) of oxygen are released after about $10^9$ actuations of the piezoelectric stack; an actuation being defined as an extension of the stack followed by a contraction.

Due to the fact that the actuator is immersed in fuel, thereby preventing air or oxygen from reaching the PZT to replace the lost oxygen atoms, the number of oxygen vacancies in a given sample of PZT increases over time. Consequently, the ability of the PZT to behave piezoelectrically falls until ultimately the actuator fails. It is believed that the fatigue experienced by the piezoelectric actuator is proportional to the number of oxygen vacancies present in the ferroelectric material. It is also believed that chemicals contained within the encapsulation layer exacerbates the formation of oxygen vacancies.

The problem of fatigue in piezoelectric actuators due to the reduction in the concentration of oxygen in PZT is addressed in United States Patent Application Publication Number US 2003/0141786 A1. This publication discloses a piezoelectric stack in which its internal interdigitated electrodes include an electrically conductive oxide for reducing the number of oxygen vacancies.

Of course, fatigue caused by oxygen vacancies in ferroelectric materials is not limited to PZT and can be found in other similar piezoelectric materials that contain oxygen, for example barium titanate, lithium niobate and lithium tantalate.

It is therefore an object of the present invention to provide an apparatus and method for alleviating or removing the aforementioned problem of fatigue in ferroelectric materials caused by oxygen vacancies.

According to the present invention, there is provided a piezoelectric actuator for use in a fuel injection system of an internal combustion engine, the actuator comprising: a stack of ferroelectric layers; an encapsulation for protecting the stack from the ingress of liquid; and oxygenation means for supplying oxygen to the ferroelectric layers, the means positioned between the encapsulation and the stack.

By means of the present invention in which oxygen is available to be supplied to the ferroelectric material, it is possible to mitigate oxygen vacancy formation in the material and hence extend the life of the actuator.

In the present invention, the oxygenation means is not applied to the surfaces of the internal electrodes of the stack during manufacture, as disclosed in US 2003/0141786 A1. Rather, in the present invention, a standard mass produced piezoelectric stack may be used, to which the oxygenation means is positioned between the stack and the encapsulation. Thus, the efficiency of production of piezoelectric stacks which contain means for reducing oxygen vacancies is increased and the associated cost is reduced.

Furthermore, because the oxygenation means is not applied to the internal electrodes of the stack, the resistivity of the internal electrodes is unaffected. Therefore, unlike with the prior art method, there is no upper limit to the amount of oxygenation means which can be applied to the stack before the electric field created by the internal electrodes is adversely affected. Since the lifetime of the actuator may at least in part depend on the amount of oxygen that can be supplied to the stack, the lifetime of the actuator of the present invention is not limited in this way.

The oxygenation means for supplying oxygen to fill the oxygen vacancies present in the ferroelectric material of the stack may be an oxidiser. An oxidiser is a chemical or compound which releases oxygen.

Preferably the oxidiser releases oxygen at or towards the upper limit of the operating temperature of the actuator. An example of such an oxidiser is potassium permanganate. Oxidisers which only release oxygen close to the upper limit of the operating temperature of the actuator reduce the possibility of excess oxygen, i.e. oxygen which does not fill oxygen vacancies, from being released. As will be appreciated, any excess oxygen released by the oxidiser may hinder operation of the actuator due to the formation of gas pockets underneath the encapsulation.

Alternatively, the oxidiser may release oxygen at or around the typical operating temperature of the actuator. The typical operating temperature of an actuator in a fuel injector system is around 90° C. An example of an oxidiser that releases oxygen at this temperature is ammonium persulphate. An oxidiser that releases oxygen at the typical operating temperature of the actuator provides a continuous supply of oxygen to the ferroelectric material when the actuator is in use, rather than releasing oxygen only when the upper limit of the operating temperature of the actuator is reached. Thereby, oxygen is provided to the ferroelectric material as oxygen vacancies are formed.

In order to further modify the release of oxygen, the piezoelectric actuator may further comprise a negative catalyst. A negative catalyst is also known to the person skilled in the art as an inhibitor. As an example, manganese dioxide acts as an inhibitor for potassium permanganate. By combining the negative catalyst and oxidiser the rate at which oxygen is released by the oxidiser is lowered and, as a consequence, the operable lifetime of the actuator is extended. Moreover, moderation of oxidisers with negative catalysts allows more oxidiser to be loaded into the actuator without the risk of gas pockets forming under the encapsulation.

As an alternative to chemical oxidisers, the oxygenation means may comprise activated carbon. Activated carbon (also known as activated charcoal) is extremely porous due to its high surface area, typically between 300 to 2,000 square metres per gram.

The activated carbon may be treated with oxygen and then used in the actuator to supply oxygen to the ferroelectric material. Due to the relatively small amount of oxygen released by the ferroelectric material, the required volume of activated carbon is small enough enable it to be positioned next to the ferroelectric material and underneath the encapsulation without necessitating the need for redesign of the fuel injector.

Alternatively, the gas supplied by the activated carbon may be nitrous oxide, but for ease and economy, the gas may simply be air.

In a further alternative embodiment of the present invention, the oxygenation means may be impregnated in porous mineral granules. These granules may be placed directly into contact with the ferroelectric material underneath the encapsulation.

The actuator may further comprise a fabric which forms a layer between the encapsulation and the stack. The fabric is preferably non-combustible and the oxygenation means may be impregnated in the fabric to ensure that oxygen is supplied evenly to the ferroelectric material. The oxygenation means may be directly impregnated into the fabric, or indirectly impregnated, for example, by attaching the porous mineral granules to the fabric.

Use of a fabric may also prevent the encapsulation coming into direct contact with the ferroelectric material; thereby reducing the exacerbation of oxygen vacancy formation described above.

In yet a further embodiment of the present invention, the oxygenation means may be held in a receptacle, such as a bag, which is preferably positioned under the encapsulation.

Alternatively, the oxygenation means may be mixed with an elastomer and applied as a liquid to the stack where it sets and preferably forms a layer between the encapsulation and the stack. The elastomer is preferably non-combustible.

The actuator of the above embodiments may further comprise a first ceramic seal positioned at an end of the stack and a second ceramic seal positioned at the other end of the stack. Preferably, the encapsulation forms a tight seal with the first and second ceramic seals. The ferroelectric layers of the stack may be separated by internal electrodes which preferably form a first group and a second group of electrodes.

BRIEF DESCRIPTION OF THE DRAWINGS

The invention will now be described, by way of example only, with reference to the accompanying drawings in which.

Figure 1:
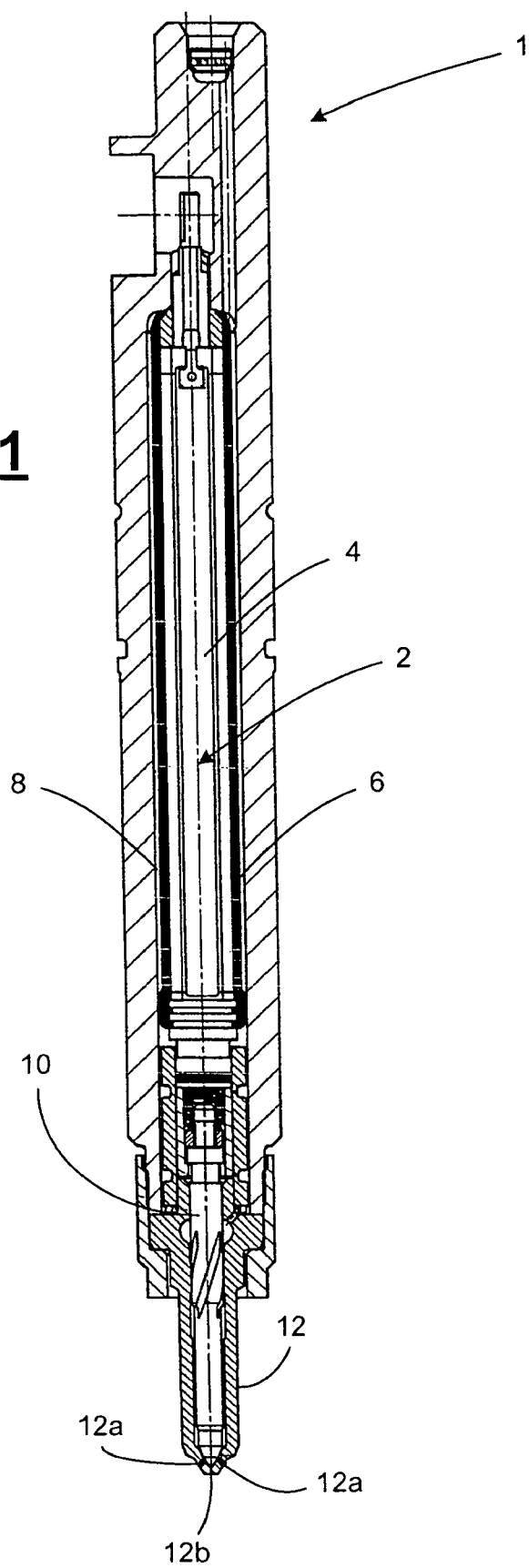
FIG. 1 illustrates a prior art fuel injector for an internal combustion engine comprising a piezoelectric actuator.
Figure 2:
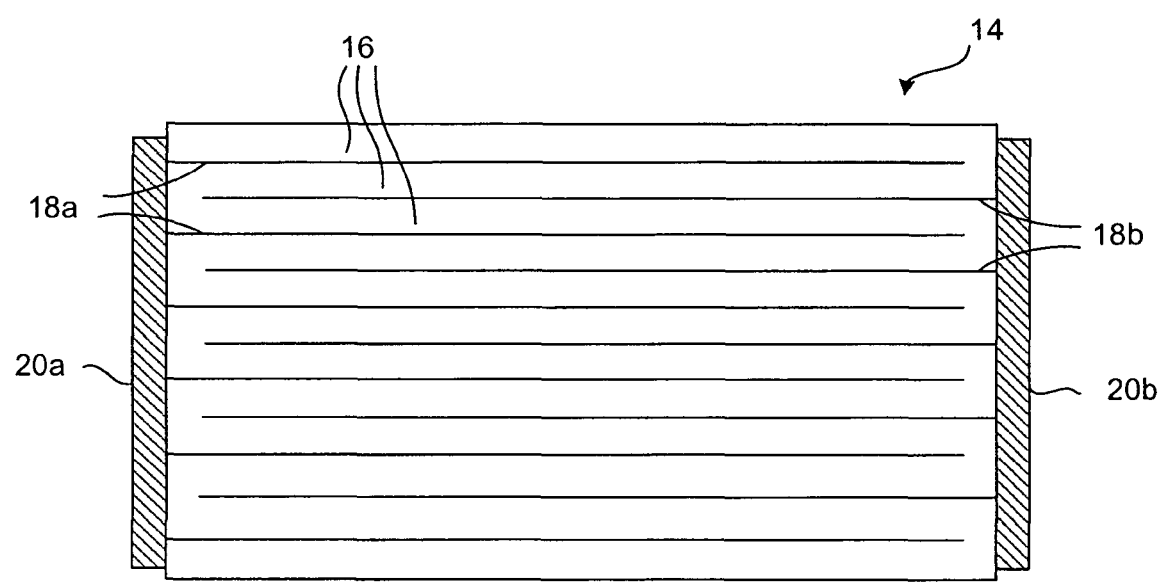
FIG. 2 illustrates a section of a multilayer piezoelectric stack.

The fuel injector of FIG. 1 and the section of a multilayer piezoelectric stack of FIG. 2 have already been described.

DESCRIPTION OF THE PREFERRED EMBODIMENT

Figure 3:
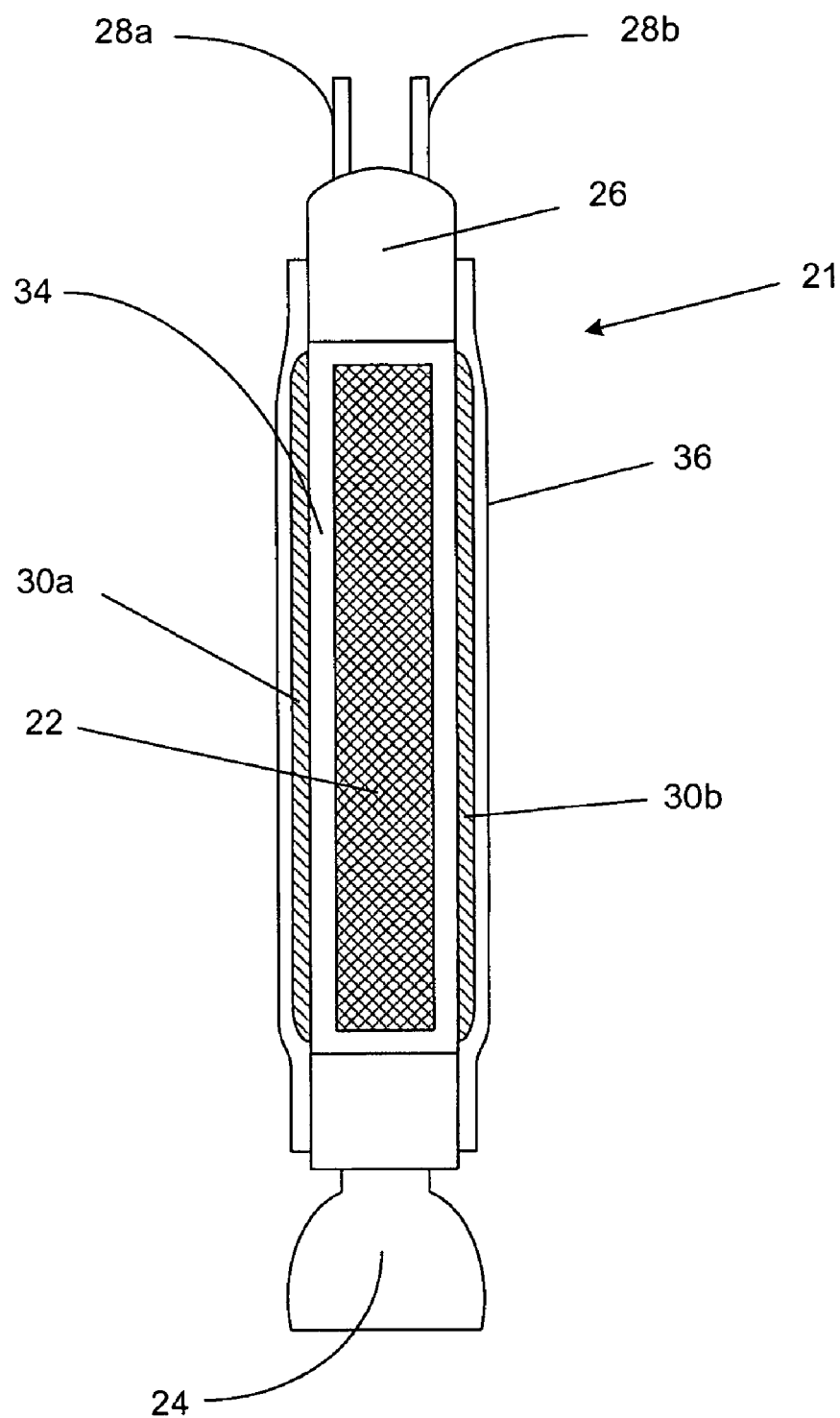
FIG. 3 is a sectional view of a piezoelectric actuator according to a first embodiment of the invention.

A piezoelectric actuator 21 according to an embodiment of the invention is shown in FIG. 3. A piezoelectric stack 34 is coupled at one end to an upper ceramic seal 26 and at its other end to a lower ceramic seal 24. The lower ceramic seal 24 is adapted to be co-operable with an injector needle (not shown). The upper ceramic seal has a first electrical terminal 28a and a second electrical terminal 28b extending therethrough. Each terminal 28a, 28b is connected to a respective first and second external electrode 30a, 30b which, in turn, are connected to internal interdigitated electrodes similar to those shown in FIG. 2 and described above.

In use, an intermittent voltage is applied via the first and second electrical terminals 28a, 28b causing the stack 34 to extend and contract as described above. An encapsulation layer 36 protects the stack 34 and external electrodes 30a, 30b from pressurised fuel contained within a stack volume (not shown).

Fabric 22 is wrapped around the stack 34 so that it is in contact with the ferroelectric material of the stack 34. The fabric 22 is sufficiently thin to allow it to be positioned under the encapsulation 36 without requiring redesign of the actuator 21 or its corresponding fuel injector (not shown) to accommodate it. The fabric 22 is impregnated with ammonium persulphate as oxidiser (not shown) before or after it is wrapped around the stack 34. Due to the small amount of oxygen released by the ferroelectric material during use, and the high concentration of oxygen in solid oxidisers, only a relatively small amount of oxidiser is required to counteract the formation of oxygen vacancies.

The present invention may be embodied in other specific forms without departing from its essential attributes. Accordingly, reference should be made to the appended claims and other general statements herein rather than to the foregoing specific description as indicating the scope of the invention.

What is claimed is:

1. A piezoelectric actuator for use in a fuel injection system of an internal combustion engine, the actuator comprising:
   a stack of ferroelectric layers;
   an encapsulation for protecting the stack from the ingress of liquid; and
   an oxygenating agent for supplying oxygen to the ferroelectric layers, the oxygenating agent being positioned between the encapsulation and the stack.

2. The piezoelectric actuator of claim 1, wherein the oxygenating agent comprises an oxidiser.

3. The piezoelectric actuator of claim 2, wherein the oxidiser releases oxygen at about the upper limit of the operating temperature of the actuator.

4. The piezoelectric actuator of claim 2, wherein the oxidiser releases oxygen at about the typical operating temperature of the actuator.

5. The piezoelectric actuator according to claim 1, further comprising a negative catalyst for moderating the supply of oxygen.

6. The piezoelectric actuator of claim 1, wherein the oxygenating agent comprises activated carbon.

7. The piezoelectric actuator of claim 6, wherein the activated carbon has been treated with a gas.

8. The piezoelectric actuator of claim 7, wherein the gas is oxygen.

9. The piezoelectric actuator of claim 7, wherein the gas is nitrous oxide.

10. The piezoelectric actuator of claim 7, wherein the gas is air.

11. The piezoelectric actuator according to claim 1, wherein the oxygenating agent is impregnated in porous mineral granules.

12. The piezoelectric actuator according to claim 1, further comprising a fabric which forms a layer between the encapsulation and the stack.

13. The piezoelectric actuator of claim 12, wherein the oxygenating agent is impregnated in the fabric.

14. The piezoelectric actuator according to claim 1, wherein the oxygenating agent is held in a receptacle.

15. The piezoelectric actuator according to claim 1, wherein the oxygenating agent is mixed with an elastomer.

16. The piezoelectric actuator of claim 15, wherein the elastomer forms a layer between the encapsulation and the stack.

17. A piezoelectric actuator for use in a fuel injection system of an internal combustion engine, the actuator comprising:
    a stack of ferroelectric layers;
    an encapsulation for protecting the stack from the ingress of liquid; and
    an oxygenating agent for supplying oxygen to the ferroelectric layers, the oxygenating agent positioned next to the stack and underneath the encapsulation.

18. The piezoelectric actuator according to claim 17, further comprising a fabric which forms a layer between the encapsulation and the stack.

19. The piezoelectric actuator of claim 18, wherein the oxygenating agent is impregnated in the fabric.

20. A piezoelectric actuator for use in a fuel injection system of an internal combustion engine, the actuator comprising:
    a stack of ferroelectric layers;
    an encapsulation for protecting the stack from the ingress of liquid; and
    an oxygenating agent for supplying oxygen to the ferroelectric layers, the oxygenating agent being impregnated in a fabric which forms a layer positioned next to the stack and underneath the encapsulation.

* * * * *